United States Patent
Fonderie

(10) Patent No.: US 8,000,113 B2
(45) Date of Patent: Aug. 16, 2011

(54) EFFICIENT POWER REGULATION FOR CLASS-E AMPLIFIERS

(75) Inventor: Maarten Jeroen Fonderie, Santa Clara, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 142 days.

(21) Appl. No.: 12/419,961

(22) Filed: Apr. 7, 2009

(65) Prior Publication Data
US 2010/0253310 A1    Oct. 7, 2010

(51) Int. Cl.
*H02M 3/335* (2006.01)
(52) U.S. Cl. .................. 363/21.02; 363/17; 363/18
(58) Field of Classification Search .................. 330/136, 330/129, 297, 298; 363/16, 20, 21, 40, 131, 363/17, 18, 21.02
See application file for complete search history.

(56) References Cited

U.S. PATENT DOCUMENTS

| | | | |
|---|---|---|---|
| 4,241,313 A | 12/1980 | Takehara | |
| 4,456,887 A | 6/1984 | Tokumo | |
| 4,780,625 A | 10/1988 | Zobel | |
| 4,820,997 A | 4/1989 | Sano et al. | |
| 5,122,759 A | 6/1992 | Nodar | |
| 5,151,852 A * | 9/1992 | Jacobson et al. | 363/131 |
| 5,280,235 A | 1/1994 | Neale et al. | |
| 5,289,137 A | 2/1994 | Nodar et al. | |
| 5,412,309 A | 5/1995 | Ueunten | |
| 5,422,600 A | 6/1995 | Petty et al. | |
| 5,455,523 A | 10/1995 | Wallace et al. | |
| 5,469,106 A | 11/1995 | Dow | |
| 5,563,526 A | 10/1996 | Hastings et al. | |
| 5,625,278 A | 4/1997 | Thiel et al. | |
| 5,666,355 A | 9/1997 | Huah et al. | |
| 5,760,652 A | 6/1998 | Maemura et al. | |
| 6,011,440 A | 1/2000 | Bell et al. | |
| 6,178,247 B1 | 1/2001 | Ogita | |

(Continued)

FOREIGN PATENT DOCUMENTS

EP    0651500 A1    3/1995

(Continued)

OTHER PUBLICATIONS

Huang, Sun-Kim, Electronic Circuit Overview (textbook), May 1980, pp. 174 and 175 (no English translation available).

(Continued)

*Primary Examiner* — Adolf Berhane
*Assistant Examiner* — Nguyen Tran
(74) *Attorney, Agent, or Firm* — Haverstock & Owens LLP

(57) ABSTRACT

A power converter device and method are provided. The power converter device includes an input power source and an input inductor configured for coupling a power of the input power source to the device. A switch is configured to regulate a power of the input power source through the input inductor. A shunting diode is coupled between the switch and the input inductor. A resonant load is coupled with the input inductor. A switching element is coupled with the input inductor and the resonant load and configured to operate at a fixed frequency. The power converter device also includes a control circuit for modulating a frequency of the switch and a driving module for driving the switching element at the fixed frequency. In an exemplary embodiment, the power converter device is a Class-E amplifier. The fixed frequency is a frequency equal to a resonant frequency of the resonant load. In one embodiment, the power converter device is configured as an integrated circuit device.

12 Claims, 9 Drawing Sheets

U.S. PATENT DOCUMENTS

| | | |
|---|---|---|
| 6,297,624 B1 | 10/2001 | Mitsui et al. |
| 6,472,935 B2 | 10/2002 | King et al. |
| 6,489,848 B2 | 12/2002 | Smith et al. |
| 6,512,411 B2 | 1/2003 | Meng et al. |
| 7,061,327 B2 | 6/2006 | Doy |
| 7,061,328 B2 | 6/2006 | Doy |
| 7,183,857 B2 | 2/2007 | Doy et al. |
| 7,495,515 B1 | 2/2009 | Branch et al. |
| 2002/0008584 A1 | 1/2002 | Manjrekar et al. |
| 2002/0186490 A1 | 12/2002 | Jiang et al. |
| 2003/0138112 A1 | 7/2003 | Doy |
| 2005/0184807 A1 | 8/2005 | Doy et al. |
| 2007/0249304 A1* | 10/2007 | Snelgrove et al. .......... 455/127.2 |
| 2010/0259231 A1* | 10/2010 | McCune, Jr. .................. 323/225 |

FOREIGN PATENT DOCUMENTS

| | | |
|---|---|---|
| JP | 61079310 | 4/1986 |
| JP | 01117423 | 5/1989 |
| JP | 01280911 | 11/1989 |
| JP | 04072902 | 3/1992 |
| JP | 05226940 | 9/1993 |
| JP | 05-347519 | 12/1993 |
| JP | 06188660 | 7/1994 |
| JP | 07-184370 | 7/1995 |
| JP | 2001508610 A | 6/2001 |
| JP | 2002092802 | 3/2002 |
| JP | 2003-087061 | 3/2003 |
| JP | 2003087061 | 3/2003 |
| JP | 2004-135016 | 4/2004 |
| JP | 2004135016 | 4/2004 |
| WO | 9743825 | 11/1997 |
| WO | 9842072 | 9/1998 |
| WO | 00/33460 | 6/2000 |

OTHER PUBLICATIONS

Dual µPower JFET-Input Operational Amplifier with Switched-Capacitor Voltage Converter, Texas Instruments Inc. pp. 1-38, (1994).

80mW, DirectDrive Stereo Headphone Driver with Shutdown, Maxim Integrated Products, pp. 1-20, Oct. 2002.

80mW, Fixed-Gain, DirectDrive, Stereo Headphone Amplifier with Shutdown, Maxim Integrated Products, pp. 1-18, Apr. 2003.

Ground-Referenced, 85mW Stereo Headphone Amplifier, National Semiconductor, pp. 1-16, Aug. 2004.

Dual µPower JFET-Input Operational Amplifier with Switched-Capacitor Voltage Converter, Texas Instruments Inc. Addendum p. 1-2, Mar. 30, 2005.

Ground-Referenced, Ultra Low Noise, Fixed Gain, 80mW Stereo Headphone Amplifier, National Semiconductor, pp. 1-22, Jun. 2005.

80-mW Cap-Free Stereo Headphone Driver, Texas Instruments Inc., pp. 1-22, Aug. 2004, revised Aug. 2005.

80-mW Cap-Free Stereo Headphone Driver, Texas Instruments Inc., Addendum pp. 1-4, Aug. 25, 2005.

Fujimoto & Partners, Foreign Office Action dated Aug. 4, 2009, Chinese Patent Application No. 2007-505288, Applicant: Maxim Integrated Products, Inc.

LT1007/FT1037, Low Noise, High Speed Precision Operational Amplifiers, Linear Technology Corporation, USA, 1989.

European Search Report dated Feb. 16, 2011, European Patent Application No. 10 015 185.1, Filed Jul. 29, 2005, Maxim Integrated Products, Inc.

Japense Decision of Refusal dated Apr. 8, 2011, Japanese Patent Application No. 2007-505288, Filed Jul. 29, 2005, Maxim Integrated Products, Inc.

* cited by examiner

EFFICIENT POWER REGULATION FOR CLASS-E AMPLIFIERS

FIELD OF THE INVENTION

The present invention relates to the field of power amplifiers. More particularly, the present invention relates to Class-E power amplifiers and power converter devices.

BACKGROUND

A Class-E amplifier converts a DC source to an amplified output signal that is sinusoidal, at a certain frequency. Class-E amplifiers are typically highly efficient switching power amplifiers.

FIG. 1 shows a conventional Class-E amplifier device 100. The device 100 includes an input power VP. A first terminal of an input inductor 110 is coupled to the input power VP. A drain of a MOSFET 112 is coupled with a second terminal of the input inductor 110 and an input terminal of a resonant LCR load or resonant load 111 having a resonant frequency. A driving module 122 is coupled with a gate of the MOSFET 112 for driving the MOSFET 112. The driving module 122 alternatively turns the MOSFET 112 on and off at a fixed frequency in response to an input signal 'Vin(freq)'. The fixed frequency is equal to the resonant frequency of the resonant load 111.

The input inductor 110 is typically a large inductor connected to the input power VP. The power stored in the input inductor 110 can be pulled down to a circuit ground through the power MOSFET 112 when the MOSFET 112 is turned on. When the MOSFET 112 is not conducting, the power in the inductor 110 is coupled to the resonant load 111. The resonant load 111 includes a first capacitor 114 coupled from the input terminal to the circuit ground. A second capacitor 116 is coupled is series with an inductor 118 between the input terminal of the resonant load 111 and an output terminal of the resonant load 111. A load circuit 120 is coupled between the output terminal of the resonant load 111 and the circuit ground. The Class-E device 100 operates the MOSFET 112 to be either in the Ohmic region or completely off.

When the MOSFET 112 is not conducting, the voltage on the drain Vdrain(freq) will go high and can be higher than the DC input voltage VP. When the MOSFET 112 turns on, the voltage on the drain Vdrain(freq) goes to the Ohmic voltage drop of the MOSFET 112. The low impedance of the MOSFET 112 causes the power that is consumed by the MOSFET 112 to be low.

In order for the device 100 of FIG. 1 to provide a single output sinusoidal voltage amplitude at a single frequency, there has to be a fixed relation between the input frequency to the MOSFET 112, the duty cycle of the input signal at this input frequency and the values of the components making up the resonant LCR load 111. Deviating from this fixed relation results in an increase of undesired harmonic distortion or reduced efficiency or both. Hence, devices similar to the device 100, attempting to effect the amplitude of the output VOUT by regulating the duty cycle of the input frequency, or by varying the LCR values will be subject to this increased harmonic distortion and reduced efficiency.

FIG. 2 shows another conventional Class-E amplifier device 200. The device 200 is similar to the device 100 of FIG. 1 except a buck converter circuit 225 is coupled between an input power source VP and an input inductor 210. In particular, the input inductor 210, the MOSFET 212, the capacitors 214 and 216, the inductor 218, the load circuit 220 and the driving module 222 correspond in function and architecture to the input inductor 110, the MOSFET 112, the capacitors 114 and 116, the inductor 118, the load circuit 120 and the driving module 122, respectively, of FIG. 1. The buck converter circuit 225 includes a switch 224 having a first terminal coupled to the input power VP and a second terminal. A diode 226 has a cathode and an anode. The cathode is coupled to the second terminal of the switch 224 and the anode is coupled to the circuit ground. A buck inductor 228 has a first terminal coupled to the cathode and a second terminal coupled to the first terminal of the input inductor 210. A buck capacitor 230 has a first terminal coupled to the second terminal of the buck inductor 228 and a second terminal coupled to ground. Like the embodiment of FIG. 1, the driving frequency of a MOSFET 212 is fixed at the resonant frequency of the resonant load 211. The device 200 uses the buck converter 225 to adjust the amplitude of the output voltage VOUT. The buck converter 225 adjusts the amplitude of the output voltage VOUT by varying or modulating the amplitude of the input power VP. The buck converter 225 operates in the usual manner of conventional buck converters. The use of the buck converter circuit 225 allows the amplitude of the E-Class amplifier circuit 200 to be adjusted. Undesirably, the buck converter 225 will reduce the overall efficiency of the E-Class amplifier circuit 200. Additionally, the buck converter 225 requires additional discrete components which will increase the cost and complexity of the circuit 200.

FIG. 3 shows another conventional Class-E amplifier device 300. The device 300 is a differential amplifier. An input power VP is coupled to a first terminal of a matching first and second input inductor 310A, 310B. A drain terminal of a first and second MOSFET 312A, 312B is coupled with a second terminal of the first and second input inductors 310A, 310B, respectively. A resonant LCR load or resonant load 311 is coupled between the second terminals of the first and second input inductors 310A, 310B. A driving module 322 is coupled with a gate of the first and second MOSFET 312A, 312B for driving the first and second MOSFET 312A, 312B. The driving module 322 alternatively turns the first and second MOSFET 312A, 312B on and off at a fixed frequency in response to an input signal Vin(freq) (not shown). The fixed frequency is equal to a resonant frequency of the resonant load 311.

The first and second input inductor 310A, 310B are typically large inductors connected to the input power VP. The power stored in the first and second input inductor 310A, 310B can be pulled down to the circuit ground through the first and second MOSFET 312A, 312B when the first and second MOSFET 312A, 312B are turned on. When the first and second MOSFET 312A, 312B are not conducting, the power in the first and second input inductor 310A, 310B are coupled to the resonant load 311. The resonant load 311 includes a matching first and second capacitors 314, 315, respectively. The first and second capacitors 314, 315 are coupled from the second terminals of the first and second input inductor 310A, 310B, respectively, to the circuit ground. A third or series capacitor 316 is coupled in series with a load circuit 320 and an inductor 318. An output terminal 'Vout' is coupled to a first and a second terminal of the load circuit 320. The Class-E device 300 operates the first and second MOSFET 312A, 312B to be either in the Ohmic region or completely off.

When the first and second MOSFET 312A, 312B are not conducting, the voltage on the drain Vdrain(freq) will go high and can be higher than the DC input voltage VP. When the first and second MOSFET 312A, 312B turn on, the voltage on the drain Vdrain(freq) goes to the Ohmic voltage drop of the first and second MOSFET 312A, 312B. The low impedance of the first and second MOSFET 312A, 312B cause the power that is consumed by the first and second MOSFET 312A, 312B to be low.

In order for the device 300 of FIG. 3 to provide a single output sinusoidal voltage amplitude at a single frequency, there has to be a fixed relation between the input frequency to the first and second MOSFET 312A, 312B, the duty cycle of the input signal at this input frequency and the values of the components making up the resonant LCR load 311. Deviating from this fixed relation results in an increase of undesired harmonic distortion or reduced efficiency or both. Hence, devices similar to device 300, attempting to effect the amplitude of the output VOUT by regulating the duty cycle of the input frequency, or by varying the LCR values will be subject to this increased harmonic distortion and reduced efficiency.

FIG. 4 shows another conventional Class-E amplifier device 400. The device 400 is similar to the device 300 of FIG. 3 except a buck converter circuit 425 is coupled between an input power source VP and a first and second input inductor 410A, 410B. In particular, the first and second input inductor 410A, 410B, a first and second MOSFET 412A, 412B, a first and second capacitor, 414 and 415, a series capacitor 416, an inductor 418, a load circuit 420 and a driving module 422 correspond in function and architecture to the first and second input inductor 310A, 310B, the first and second MOSFET 312A, 312B, the first and second capacitor, 314 and 315, the series capacitor 316, the inductor 318, the load circuit 320 and the driving module 322, respectively, of FIG. 3. The buck converter circuit 425 includes a switch, diode, inductor and capacitor (FIG. 2). Like the embodiment of FIG. 3, the driving frequency of the first and second MOSFET 412A, 412B is fixed at the resonant frequency of the resonant load 411. The device 400 uses the buck converter 425 to adjust the amplitude of the output voltage VOUT. The buck converter 425 adjusts the amplitude of the output voltage VOUT by varying or modulating the amplitude of the input power VP. The buck converter 425 operates in the usual manner of conventional buck converters. The use of the buck converter circuit 425 allows the amplitude of the E-Class amplifier circuit 400 to be adjusted. Undesirably, the buck converter 425 will reduce the overall efficiency of the E-Class amplifier circuit 200. Additionally, the buck converter 225 requires additional discrete components which will increase the cost and complexity of the circuit 400.

Accordingly, it is desirable to provide a Class-E amplifier device which is more efficient and more economical to produce. In addition it is desirable to provide a Class-E amplifier device that provides optimization of power transferred to a load circuit.

SUMMARY OF THE INVENTION

In accordance with a first aspect of the present invention, a power converter device is provided. The power converter device includes an input power source. An input inductor is configured for coupling a power of the input power source to the device. A switch is configured to regulate a power of the input power source through the input inductor to adjust an output voltage of the device. A shunting diode is coupled between the switch and the input inductor. A resonant load is coupled with the input inductor comprising a first capacitor, a second capacitor, a series inductor and a load circuit. A switching element is coupled with the input inductor and the resonant load and is configured to operate at a fixed frequency. The power converter device also includes a control circuit for modulating a frequency of the switch and includes a driving module for driving the switching element at the fixed frequency.

In an exemplary embodiment, the power converter device is a Class-E amplifier and the input power source is a 20 VDC voltage source. The switch can be a MOSFET device. The shunting diode is configured for shunting the power stored in the input inductor when the switch is open. In one embodiment, the shunting diode can instead be a MOSFET device and the switch is a complimentary MOSFET device. The fixed frequency is preferably a frequency equal to a resonant frequency of the resonant load. The first and the second capacitors are shunting and series capacitors, respectively. The series capacitor and the series inductor are coupled between the shunting capacitor and the load circuit. In one embodiment, the power converter device is configured as an integrated circuit device.

In accordance with a second aspect of the present invention, a method of converting power in a power converter device is provided. The method includes providing an input power source. A power of the input power source is coupled through an input inductor. A power of the input power source through the input inductor is regulated using a switch coupled between the input power source and the input inductor. The power of the input inductor is shunted when the switch is open using a shunting diode coupled to ground between the switch and the input inductor. A switching element is operated at a fixed frequency and is coupled with the input inductor and a resonant load. The method also includes modulating a frequency of the switch using a control circuit and driving the switching element at the fixed frequency using a driving module.

In an exemplary embodiment, the power converter device is a Class-E amplifier and the input power source is a 20 VDC voltage source. The switch can be a MOSFET device. The shunting diode is configured for shunting the power stored in the input inductor when the switch is open. In one embodiment, the shunting diode can instead be a MOSFET device and the switch is a complimentary MOSFET device. In this complimentary configuration, the first and the second MOSFET devices are operated 180 degrees out of phase with each other. The fixed frequency is a frequency equal to a resonant frequency of the resonant load. The first and the second capacitors are shunting and series capacitors, respectively. The series capacitor and the series inductor are coupled between the shunting capacitor and the load circuit. In one embodiment, the power converter device is configured as an integrated circuit device.

In accordance with a third aspect of the present invention, a differential power converter device is provided. The device includes an input power source. A first and a second input inductor are configured for coupling a power of the input power source to the device. A switch is configured to regulate a power of the input power source through the first and the second input inductor. A shunting diode is configured for shunting the power stored in the first and the second input inductor when the switch is open. A resonant load is coupled with the first and the second input inductor comprising a first, second and a third capacitor, a series inductor and a load circuit. A first and a second switching element are coupled with the first and the second input inductor, respectively, and coupled with the resonant load. The first and the second switching element are configured to operate at a fixed frequency. The differential power converter device also includes a control circuit for modulating a frequency of the switch and includes a driving module for driving the first and the second switching element at the fixed frequency.

In an exemplary embodiment, the power converter device is a Class-E amplifier and the input power source is a 20 VDC voltage source. The switch can be a MOSFET device. The shunting diode is coupled between the switch and the first and second input inductors. In one embodiment, the shunting diode can instead be a MOSFET device and the switch is a complimentary MOSFET device. The fixed frequency is a frequency equal to a resonant frequency of the resonant load. The first and the second capacitors are shunting capacitors, and the third capacitor is a series capacitor. The load circuit is coupled between the series capacitor and the series inductor. In one embodiment, the power converter device is configured as an integrated circuit device.

Other features of the present invention will become apparent from consideration of the following description taken in conjunction with the accompanying drawings.

BRIEF DESCRIPTION OF THE DRAWINGS

The novel features of the invention are set forth in the appended claims. However, for purposes of explanation, several embodiments of the invention are set forth in the following figures.

DETAILED DESCRIPTION

In the following description, numerous details and alternatives are set forth for the purpose of explanation. However, one of ordinary skill in the art will realize that the invention can be practiced without the use of these specific details. In other instances, well-known structures and devices are shown in block diagram form in order not to obscure the description of the invention with unnecessary detail.

The present invention provides a power converting circuit with an increased efficiency of Class-E amplifiers and power converters. The present invention provides optimization of power transferred to a load circuit. The present invention also provides a savings of an inductor and capacitor from a customer bill of materials for each device made according to the invention. The present invention is a significant improvement over conventional Class-E amplifiers that use conventional buck converter circuits.

Figure 1:
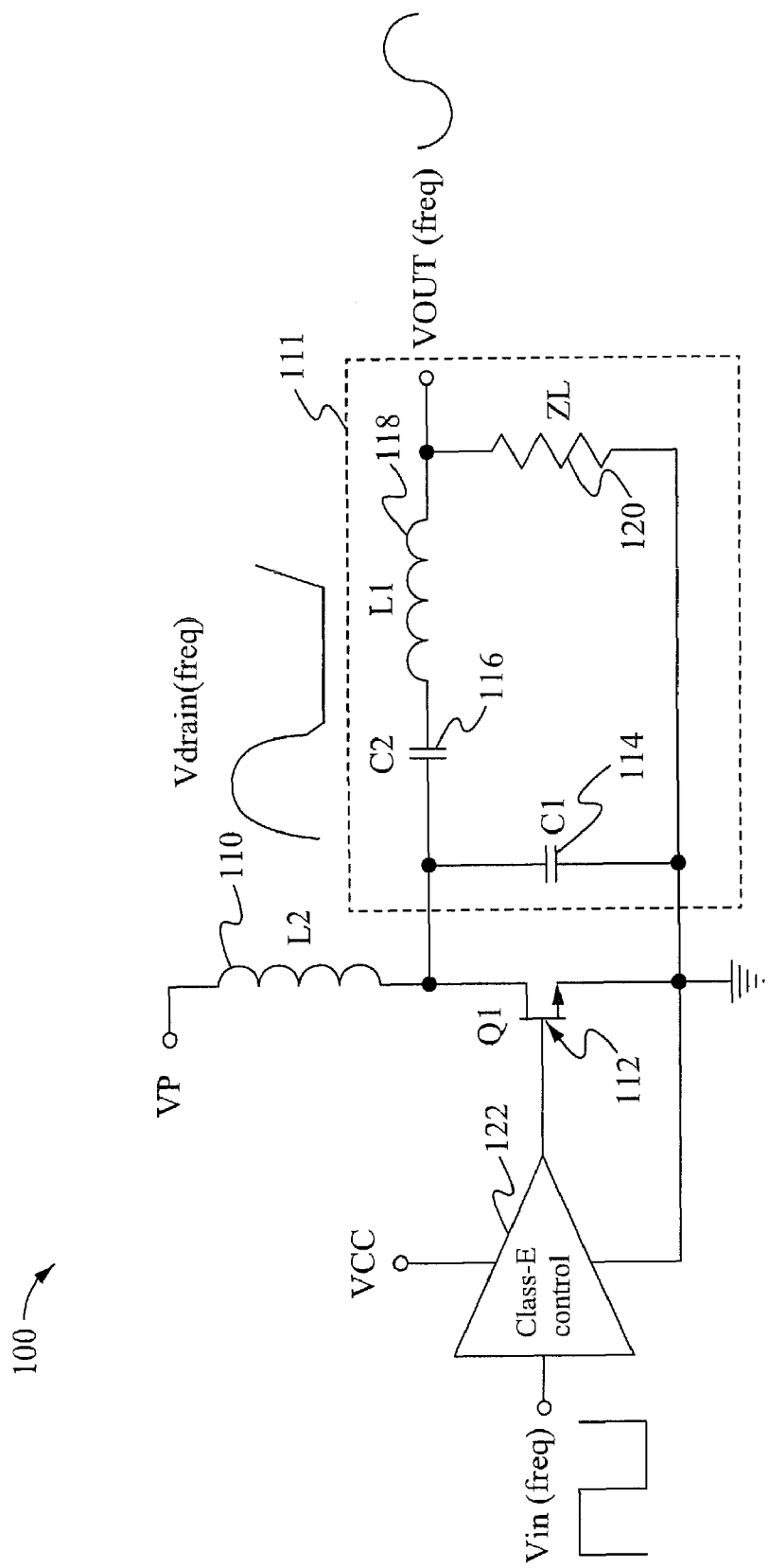
FIG. 1 illustrates a first prior art schematic diagram of a Class-E amplifier device.
Figure 2:
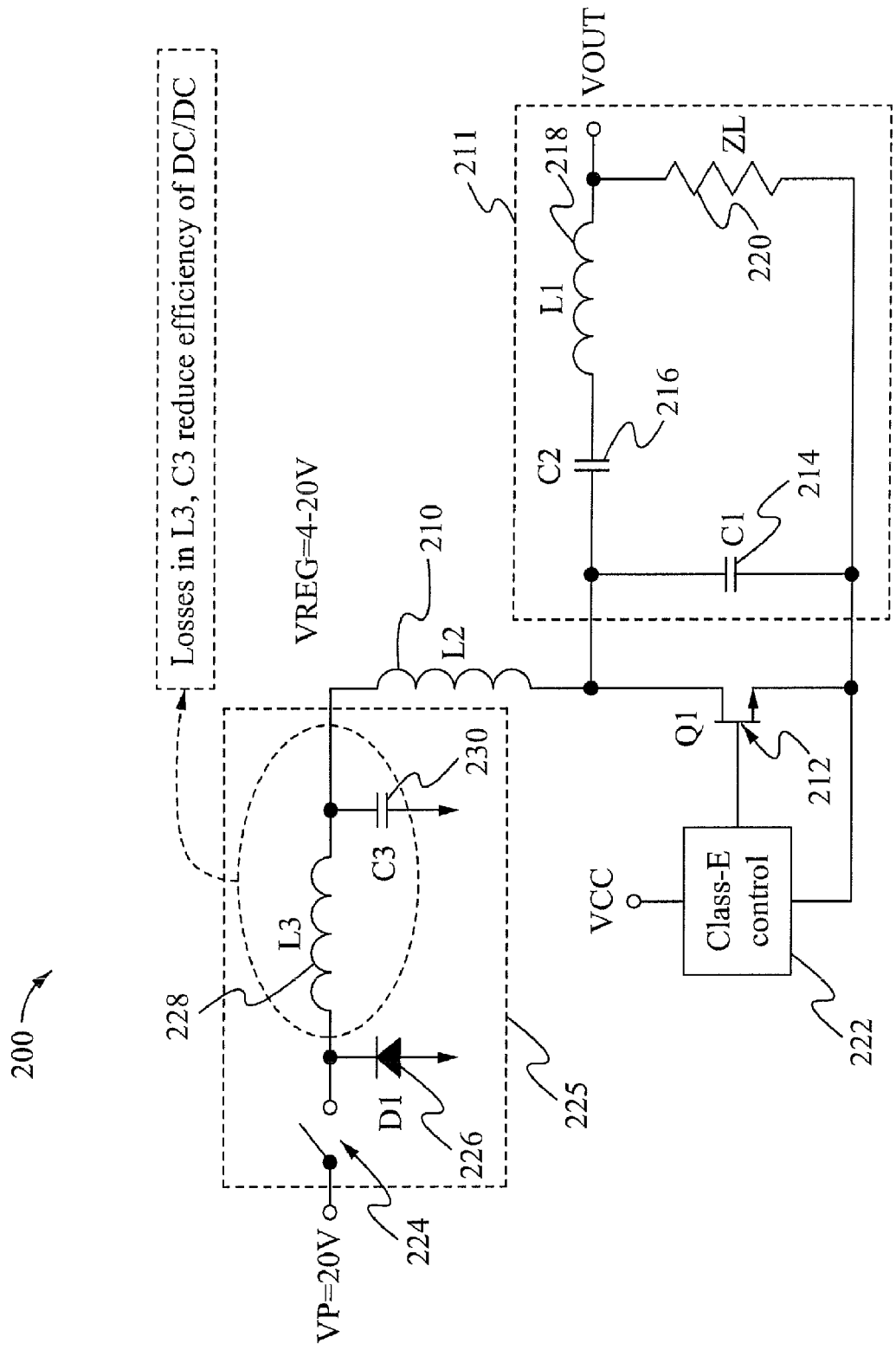
FIG. 2 illustrates an alternative embodiment of the prior art device of FIG. 1.
Figure 3:
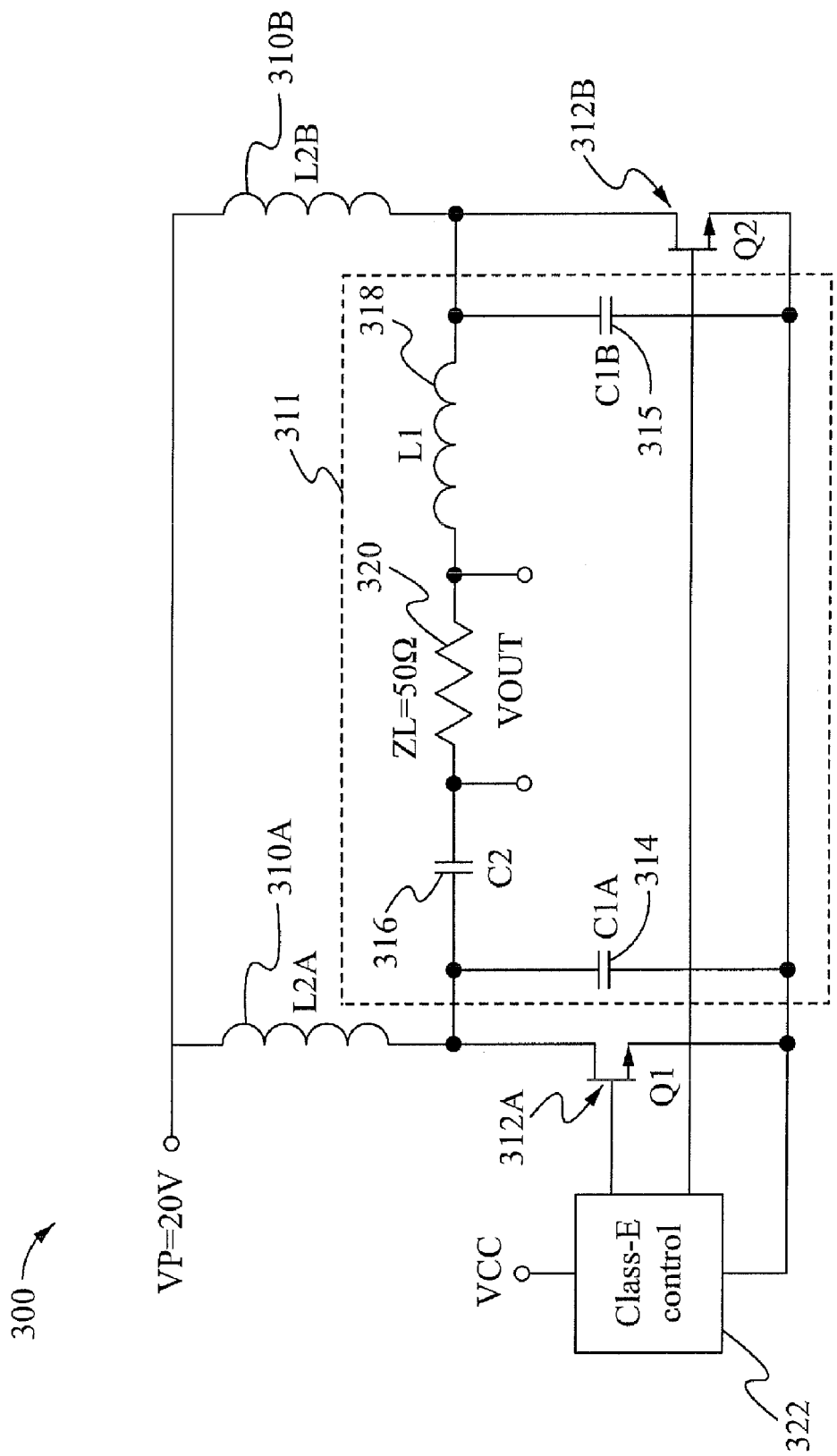
FIG. 3 illustrates a second prior art schematic diagram of a Class-E amplifier device.
Figure 4:
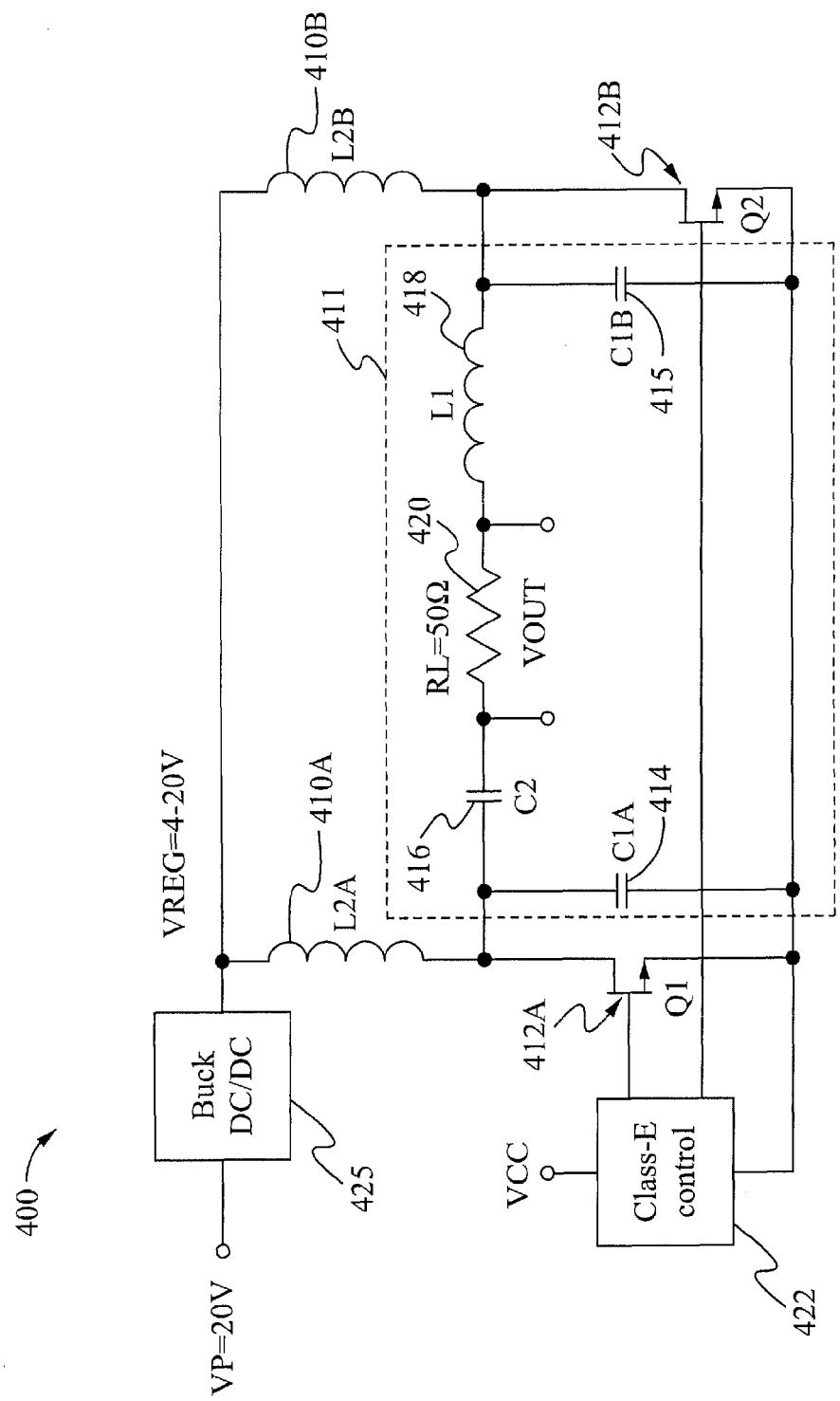
FIG. 4 illustrates an alternative embodiment of the prior art device of FIG. 3.
Figure 5:
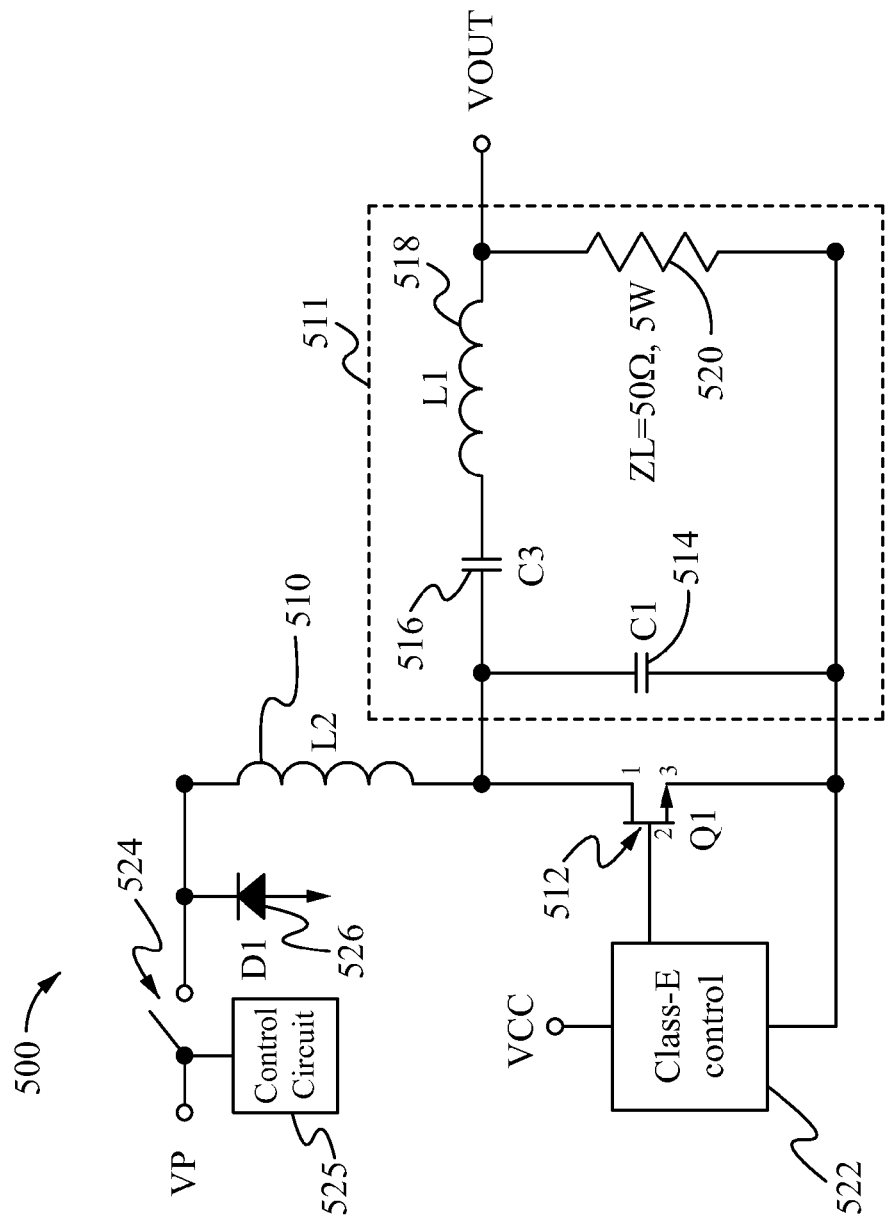
FIG. 5 illustrates a schematic diagram of a Class-E amplifier device according to an embodiment of the present invention.

Turning to FIG. 5, a schematic diagram of a power converting device 500 is shown according to an embodiment of the present invention. The device 500 comprises an input power source 'VP' coupled to a first terminal of an input inductor 510. A switch 524 selectively couples the input power source VP to the input inductor 510 to regulate a power of the input power source VP. A cathode of a shunting diode 526 is coupled between the switch 524 and the input inductor 510. The anode of the shunting diode 526 is coupled to ground. A resonant circuit or resonant load 511 is coupled to a second terminal of the input inductor 510. The resonant load 511 comprises a first capacitor 514 coupled between the second terminal of the input inductor 510 and ground. A second capacitor 516 is coupled in series with a series inductor 518 both coupled between the second terminal of the input inductor 510 and an output terminal 'Vout'. A load circuit 520 is coupled between Vout and ground. A switching element 512 is coupled in parallel with the first capacitor 514 and is configured to operate at a fixed frequency. A second terminal of the switching element 512 is driven by a driving module 522 at the fixed frequency. The driving module 522 is coupled between VCC and ground. In an exemplary embodiment VCC equals 5 VDC. Other values for VCC that are higher or lower than 5 VDC can be chosen without departing from the invention.

In an exemplary embodiment, the device 500 comprises an integrated circuit (not shown). The integrated circuit includes the switch 524, the shunting diode 526, the switching element 512 and the driving module 522 incorporated into the silicon of the integrated circuit. The input inductor 510 and the resonant load 511 are configured external to the silicon of the integrated circuit. In an alternative embodiment, the device 500 can be provided using solely discrete components. In application, the device 500 is suitable for a Class-E amplifier. Alternatively, the device 500 can be suited for power conversion devices. The power conversion devices well suited for the device 500 can include wireless power conversion devices.

The input power source VP comprises a DC voltage signal. In an exemplary embodiment, the input power source VP comprises a 20 VDC signal. A person of ordinary skill will appreciate that other values for the DC voltage signal may be used. The input inductor 510 comprises a suitable inductor for sinking the current of the input power source VP. The shunting diode 526 that is coupled between the switch 524 and the input inductor 510 provides a current path to ground for power stored in the input inductor 510. The power in the input inductor 510 flows back through the shunting diode 526 when the switch 524 is open or off.

The switch 524 is configured to cycle at a rate to control the power through the input inductor 510. A suitable control circuit 525 including a pulse width modulation circuit as practiced by a person of ordinary skill can be used to set a duty cycle of the switch 524. In an exemplary embodiment, the switch 524 can be configured to operate in an open loop manner. In the open loop manner, a frequency and the duty cycle of the switch 524 are set at a constant value. In a first 'protection' embodiment, the switch 524 can be used to protect the switching element 512 against over-voltage. In this first protection embodiment, the frequency of the switch 524 can be operated as a function of the voltage of the first terminal of the switching element 512. In a second 'protection' embodiment, the switch 524 can be used to prevent excessive power dissipation of the device 500. In this second protection embodiment, the frequency of the switch 524 can be operated as a function of the voltage to the load circuit 520 or the voltage VOUT. In still a third 'protection' embodiment or a fuse-link embodiment, the switch 524 can include a 100 percent duty cycle or continuously on/closed and be operated so that the switch 524 opens when a high current condition is sensed. Thereby protecting the device 500 from a destructively high current. Any suitable current value can be chosen to operate the fuse-link embodiment depending on the application.

The resonant load 511 comprises the first and the second capacitors 514, 516, the series inductor 518 and the load circuit 520. In an exemplary embodiment, each of the components chosen for the resonant load 511 comprises a fixed relationship between the fixed frequency of the driving module 522, the duty cycle of the switching element 512 and a value of the components of the resonant load 511 including the series inductor 518, the first and the second capacitor 514, 516 and the load circuit 520. The fixed frequency of the driving module 522 is equal to a resonant frequency of the resonant load 511. The first and the second capacitors 514, 516 are configured as shunting and series capacitors, respectively. The resistive value of the load circuit 520 can vary depending on the application of the device 500. In an exemplary embodiment, the resistance of the load circuit 520 comprises 50 ohms with a power rating of five watts. The values of the second capacitor 516 and the series inductor 518 can be chosen to achieve the desired resonant frequency of the resonant load 511.

The switching element 512 comprises a suitable switching device for efficient operation of the device 500. In an exemplary embodiment, the switching element 512 comprises an n-type metal-oxide-semiconductor field-effect transistor (MOSFET) device. The MOSFET device includes a drain, a gate and a source that are synonymous with the first, the second and the third terminal, respectively of the switching element 512. Alternatively, any other semiconductor switching device known to a person of ordinary skill can be substituted for the switching element 512. The switching element 512 is configured to operate at the fixed frequency of the driving module 522. The switching element 512 is configured to operate with high efficiency and is configured to consume very little power. When the switching element 512 is turned on, the power consumed by the switching element 512 is approximately zero since the voltage of the drain or first terminal of the switching element 512 is close to zero volts DC. When the switching element 512 is turned off, the power consumed by the switching element 512 is also approximately zero since the voltage of the drain or the first terminal of the switching element 512 is approximately zero and the current through the switching element 512 is approximately zero.

The driving module 522 comprises a control circuit suitable for providing a sufficient signal to drive the switching element 512. The driving module 522 operates at the fixed frequency equal to the resonant frequency of the resonant load 512. The driving module 522 can comprise a pulse width modulation (PWM) circuit configured to operate at the fixed frequency. Other oscillators can also be used. In an exemplary embodiment, a digital input signal (not shown) is used to enable the driving module 522. The digital input signal comprises a frequency equal to the fixed frequency.

Figure 5C:
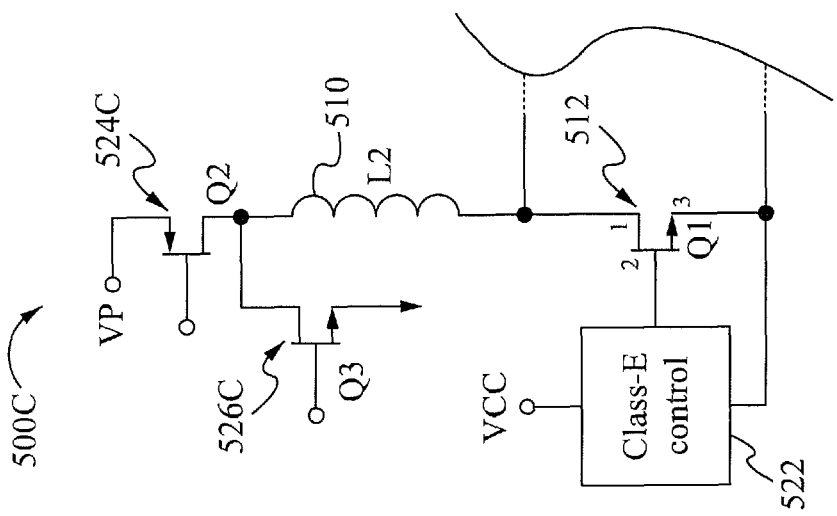
FIGS. 5A through 5C illustrate partial schematic diagrams of a Class-E amplifier device according to alternative embodiments of the device of FIG. 5.
Figure 5B:
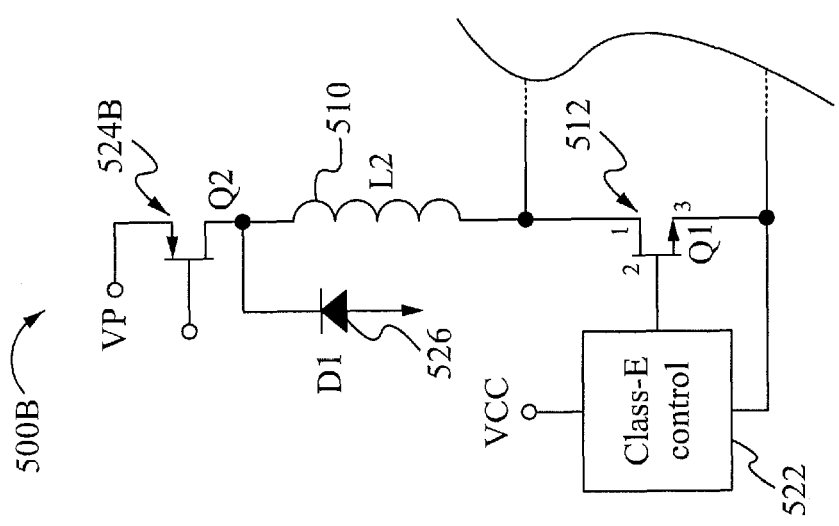
Figure 5A:
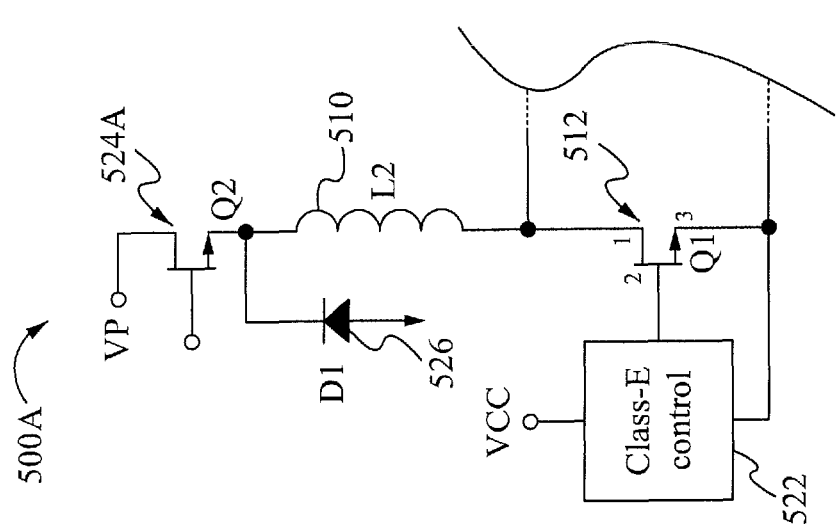

Turning to FIGS. 5A through 5C, partial schematic diagrams of alternative embodiments of devices 500A, 500B and 500C are shown. The device 500A of the FIG. 5A shows an embodiment of the invention similar to the device 500 of FIG. 5. The device 500A includes an n-type MOSFET device 524A substituted for the switch 524 of FIG. 5. In an exemplary embodiment, the MOSFET device 524A comprises a DMOS or double-Diffused MOSFET known to a person of ordinary skill. Alternatively, any other semiconductor switching device known to a person of ordinary skill can be substituted for the MOSFET device 524A. The MOSFET device 524A is configured to operate at a duty cycle to suit the particular application. The remainder of the device 500A is similar in operation and structure to the device 500 as described above.

The device 500B of the FIG. 5B shows another embodiment of the invention similar to the device 500 of FIG. 5. The device 500B includes a p-type MOSFET device 524B substituted for the switch 524 of FIG. 5. In an exemplary embodiment the MOSFET device 524B comprises a DMOS or double-Diffused MOSFET known to a person of ordinary skill. Alternatively, any other semiconductor switching device known to a person of ordinary skill can be substituted for the MOSFET device 524B. The MOSFET device 524B is configured to operate at a duty cycle to suit the particular application. The remainder of the device 500B is similar in operation and structure to the device 500 as described above.

The device 500C of the FIG. 5C shows yet another embodiment of the invention similar to the device 500 of FIG. 5. The device 500C includes a p-type MOSFET switch device 524C substituted for the switch 524 of FIG. 5 and also includes an n-type MOSFET shunting device 526C substituted for the shunting diode 526 of FIG. 5. In an exemplary embodiment, the MOSFET switch and shunting devices 524C, 526C comprise the DMOS type known to a person of ordinary skill. Alternatively, any other semiconductor switching devices known to a person of ordinary skill can be substituted for the MOSFET switch and shunting devices 524C, 526C. The MOSFET switch device 524C is configured to operate at a duty cycle to suit the particular application. The MOSFET switch device 524C and the MOSFET shunting device 526C are configured to operate synchronously. The synchronous operation of the MOSFET switch and shunting devices 524B, 524C includes enabling each the MOSFET switch device 524C and the MOSFET shunting device 526C so each is 180 degrees out of phase with the other. The remainder of the device 500C is similar in operation and structure to the device 500 as described above.

Figure 6:
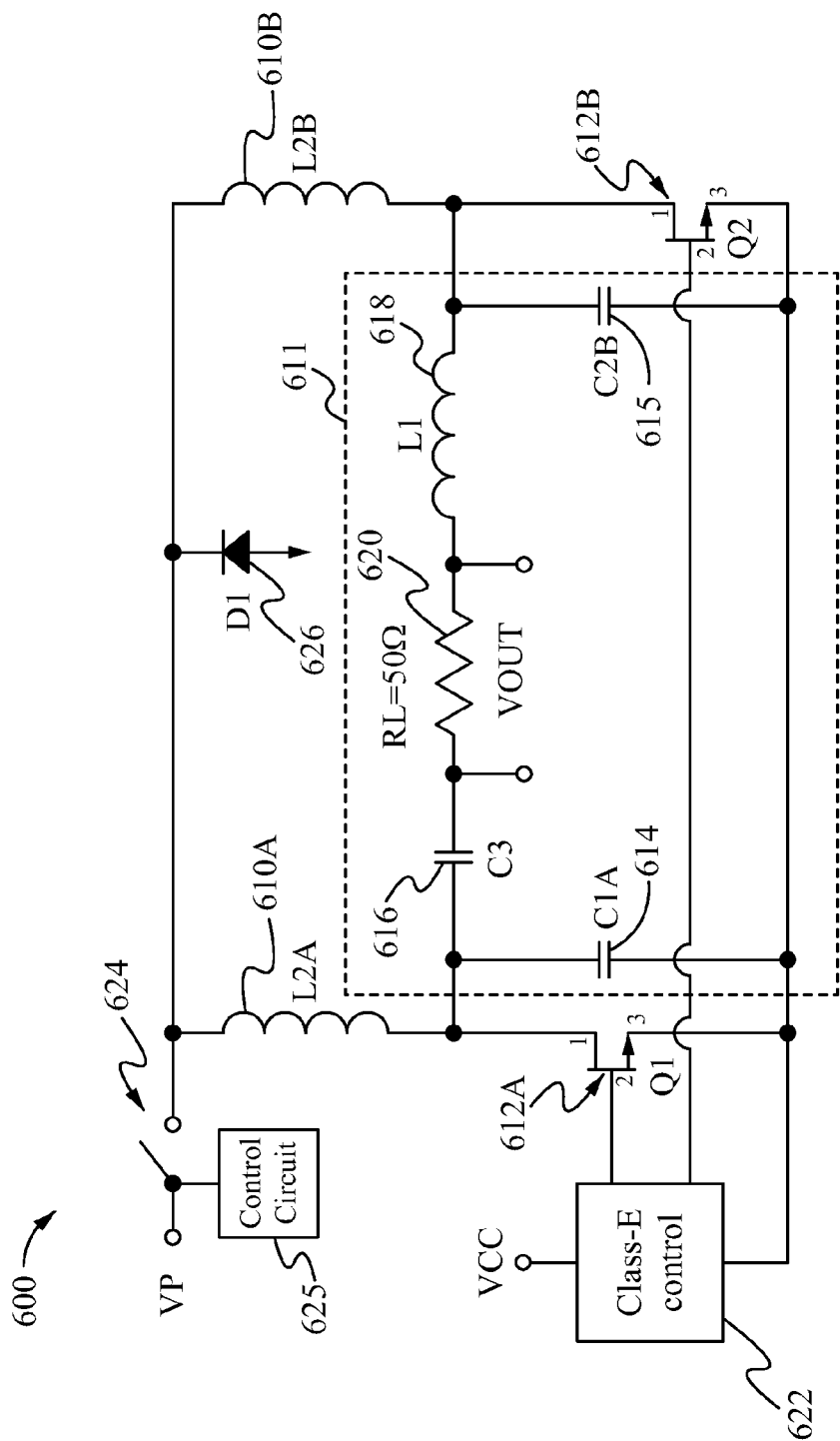
FIG. 6 illustrates a schematic diagram of a Class-E amplifier device according to another embodiment of the present invention.

Turning to FIG. 6, a schematic diagram of a differential power converting device 600 is shown according to an embodiment of the present invention. The device 600 comprises an input power source 'VP' coupled to a first terminal of matching first and second input inductors 610A, 610B, respectively. A switch 624 selectively couples the input power source VP to the first and second input inductors 610A, 610B to regulate a power of the input power source VP. A cathode of a shunting diode 626 is coupled between the switch 624 and the first and second input inductors 610A, 610B. The anode of the shunting diode 626 is coupled to ground. A resonant circuit or resonant load 611 is coupled between a second terminal of the first and second input inductors 610A, 610B. The resonant load 611 includes a matching first and second capacitor 614, 615 coupled between the second terminal of the first and second input inductors 610A, 610B, respectively, and ground. A third or series capacitor 616 is coupled in series with a load circuit 620 and an inductor 618. An output terminal 'Vout' is coupled to a first and a second terminal of the load circuit 620. A first and a second switching element 612A, 612B are coupled in parallel with the first and the second capacitor 614, 615 and are configured to operate at a fixed frequency. A second terminal of the first and a second switching element 612A, 612B are driven by a driving module 622 at the fixed frequency. The driving module 622 is coupled between VCC and ground. In an exemplary embodiment VCC equals 5 VDC. Other values for VCC that are higher or lower than 5 VDC can be chosen without departing from the invention.

In an exemplary embodiment, the device 600 comprises an integrated circuit (not shown). The integrated circuit includes the switch 624, the shunting diode 626, the first and the second switching elements 612A, 612B and the driving module 622 incorporated into the silicon of the integrated circuit. The first and second input inductors 610A, 610B and the resonant load 611 are configured external to the silicon of the integrated circuit. In an alternative embodiment, the device 600 can be provided using solely discrete components. In application, the device 600 is suitable for a Class-E amplifier. Alternatively, the device 600 can be suited for power conversion devices. The power conversion devices well suited for the device 600 can include wireless power conversion devices.

The input power source VP comprises a DC voltage signal. In an exemplary embodiment, the input power source VP comprises a 20 VDC signal. A person of ordinary skill will appreciate that other values for the DC voltage signal may be used. The first and second input inductors 610A, 610B comprise suitable inductors for sinking the current of the input power source VP. The shunting diode 626 provides a current path to ground for power stored in the first and second input inductors 610A, 610B. The power in the first and second input inductors 610A, 610B flows back through the shunting diode 626 when the switch 624 is open or off.

The switch 624 is configured to cycle at a rate to control the power through the first and second input inductors 610A, 610B. A suitable control circuit 625 including a pulse width modulation circuit as practiced by a person of ordinary skill can be used to set a duty cycle of the switch 624. In an exemplary embodiment, the switch 624 can be configured to operate in an open loop manner. In the open loop manner, a frequency and the duty cycle of the switch 624 are set at a constant value. In a first 'protection' embodiment, the switch 624 can be used to protect the first and the second switching elements 612A, 612B against over-voltage. In this first protection embodiment, the frequency of the switch 624 can be operated as a function of the voltage of the first terminals of the first and the second switching elements 612A, 612B. In a second 'protection' embodiment, the switch 624 can be used to prevent excessive power dissipation of the device 600. In this second protection embodiment, the frequency of the switch 624 can be operated as a function of the voltage to the load circuit 620 or the voltage VOUT. In still a third 'protection' embodiment or a fuse-link embodiment, the switch 624 can include a 100 percent duty cycle or continuously on/closed and be operated so that the switch 624 opens when a high current condition is sensed. Thereby protecting the device 600 from a destructively high current. Any suitable current value can be chosen to operate the fuse-link embodiment depending on the application.

The resonant load 611 comprises the matching first and second capacitors 614, 615, the third capacitor 616, the series inductor 618 and the load circuit 620. In an exemplary embodiment, each of the components chosen for the resonant load 611 comprises a fixed relationship between the fixed frequency of the driving module 622, the duty cycle of the first and the second switching elements 612A, 612B and a value of the components of the resonant load 611. The fixed frequency of the driving module 622 is equal to a resonant frequency of the resonant load 611. The first and second capacitors 614, 615 are configured as shunting capacitors. The third capacitor 616 is configured as a series capacitor. The resistive value of the load circuit 620 can vary depending on the application of the device 600. In an exemplary embodiment, the resistance of the load circuit 620 comprises 50 ohms with a power rating of five watts. The values of third capacitor 616 and the series inductor 618 can be chosen to achieve the desired resonant frequency of the resonant load 611.

The first and the second switching elements 612A, 612B comprise suitable switching devices for efficient operation of the device 600. In an alternative embodiment, the first and the second switching elements 612A, 612B comprise n-type MOSFET devices. The MOSFET devices include a drain, a gate and a source that are synonymous with the first, the second and the third terminal, respectively of the first and the second switching elements 612A, 612B. Alternatively, any other semiconductor switching device known to a person of ordinary skill can be substituted for the first and the second switching elements 612A, 612B. The first and the second switching elements 612A, 612B are configured to operate at the fixed frequency of the driving module 622. The first and the second switching elements 612A, 612B are configured to operate with high efficiency and are configured to consume very little power. When the first and the second switching elements 612A, 612B are turned on, the power they consume is approximately zero since the voltage of the drain or first terminal of the first and the second switching elements 612A, 612B is close to zero volts DC. When the first and the second switching elements 612A, 612B are turned off, the power they consume is also approximately zero since the voltage of the drain or the first terminal of the first and the second switching elements 612A, 612B is approximately zero and the current through the first and the second switching elements 612A, 612B is approximately zero.

The driving module 622 comprises a control circuit suitable for providing a sufficient signal to drive the first and the second switching elements 612A, 612B. The driving module 622 operates at the fixed frequency equal to the resonant frequency of the resonant load 611. The driving module 622 can comprise a pulse width modulation (PWM) circuit configured to operate at the fixed frequency. Other oscillators can also be used. In an exemplary embodiment, a digital input signal (not shown) is used to enable the driving module 622. The digital input signal comprises a frequency equal to the fixed frequency.

Figures 6A, 6B, 6C:
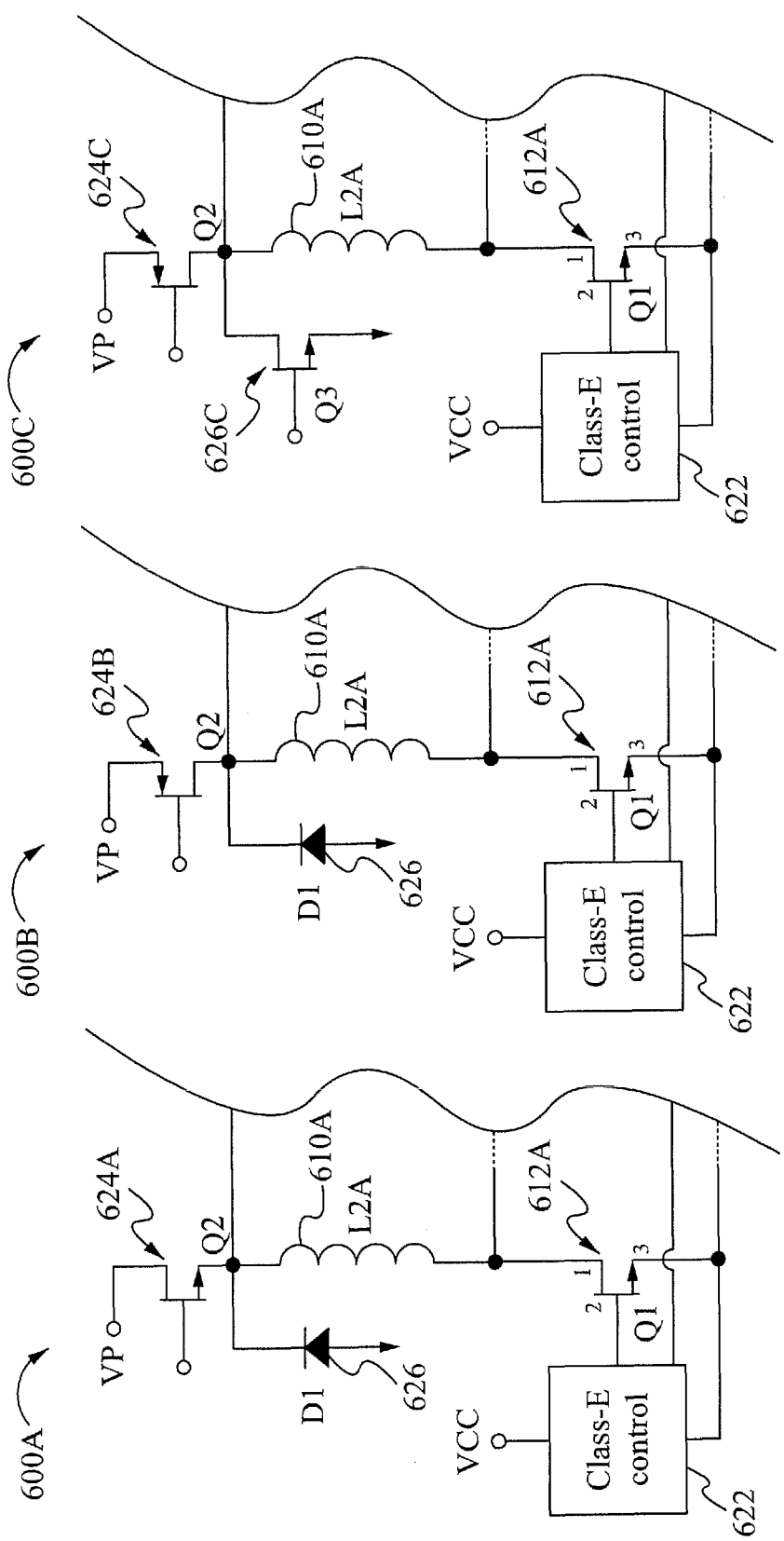
FIGS. 6A through 6C illustrate partial schematic diagrams of a Class-E amplifier device according to alternative embodiments of the device of FIG. 6.

Turning to FIGS. 6A through 6C, partial schematic diagrams of alternative embodiments of devices 600A, 600B and 600C are shown. The device 600A of the FIG. 6A shows an embodiment of the invention similar to the device 600 of FIG. 6. The device 600A includes an n-type MOSFET device 624A substituted for the switch 624 of FIG. 6. In an exemplary embodiment the MOSFET device 624A comprises a DMOS or double-Diffused MOSFET known to a person of ordinary skill. Alternatively, any other semiconductor switching device known to a person of ordinary skill can be substituted for the MOSFET device 624A. The MOSFET device 624A is configured to operate at a duty cycle to suit the particular application. The remainder of the device 600A is similar in operation and structure to the device 600 as described above.

The device 600B of the FIG. 6B shows another embodiment of the invention similar to the device 600 of FIG. 6. The device 600B includes a p-type MOSFET device 624B substituted for the switch 624 of FIG. 6. In an exemplary embodiment the MOSFET device 624B comprises a DMOS device known to a person of ordinary skill. Alternatively, any other semiconductor switching device known to a person of ordinary skill can be substituted for the MOSFET device 624B. The MOSFET device 624B is configured to operate at a duty cycle to suit the particular application. The remainder of the device 600B is similar in operation and structure to the device 600 as described above.

The device 600C of the FIG. 6C shows yet another embodiment of the invention similar to the device 600 of FIG. 6. The device 600C includes a p-type MOSFET switch device 624C substituted for the switch 624 of FIG. 6 and also includes an n-type MOSFET shunting device 626C substituted for the shunting diode 626 of FIG. 6. In an exemplary embodiment the MOSFET switch and shunting devices 624C, 626C comprise the DMOS type known to a person of ordinary skill. Alternatively, any other semiconductor switching devices known to a person of ordinary skill can be substituted for the MOSFET switch and shunting devices 624C, 626C. The MOSFET switch device 624C is configured to operate at a duty cycle to suit the particular application. The MOSFET switch device 624C and the MOSFET shunting device 626C are configured to operate synchronously. The synchronous operation of the MOSFET switch and shunting devices 624B, 624C includes enabling each the MOSFET switch device 624C and the MOSFET shunting device 626C so each is 180 degrees out of phase with the other. The remainder of the device 600C is similar in operation and structure to the device 600 as described above.

Figure 7:
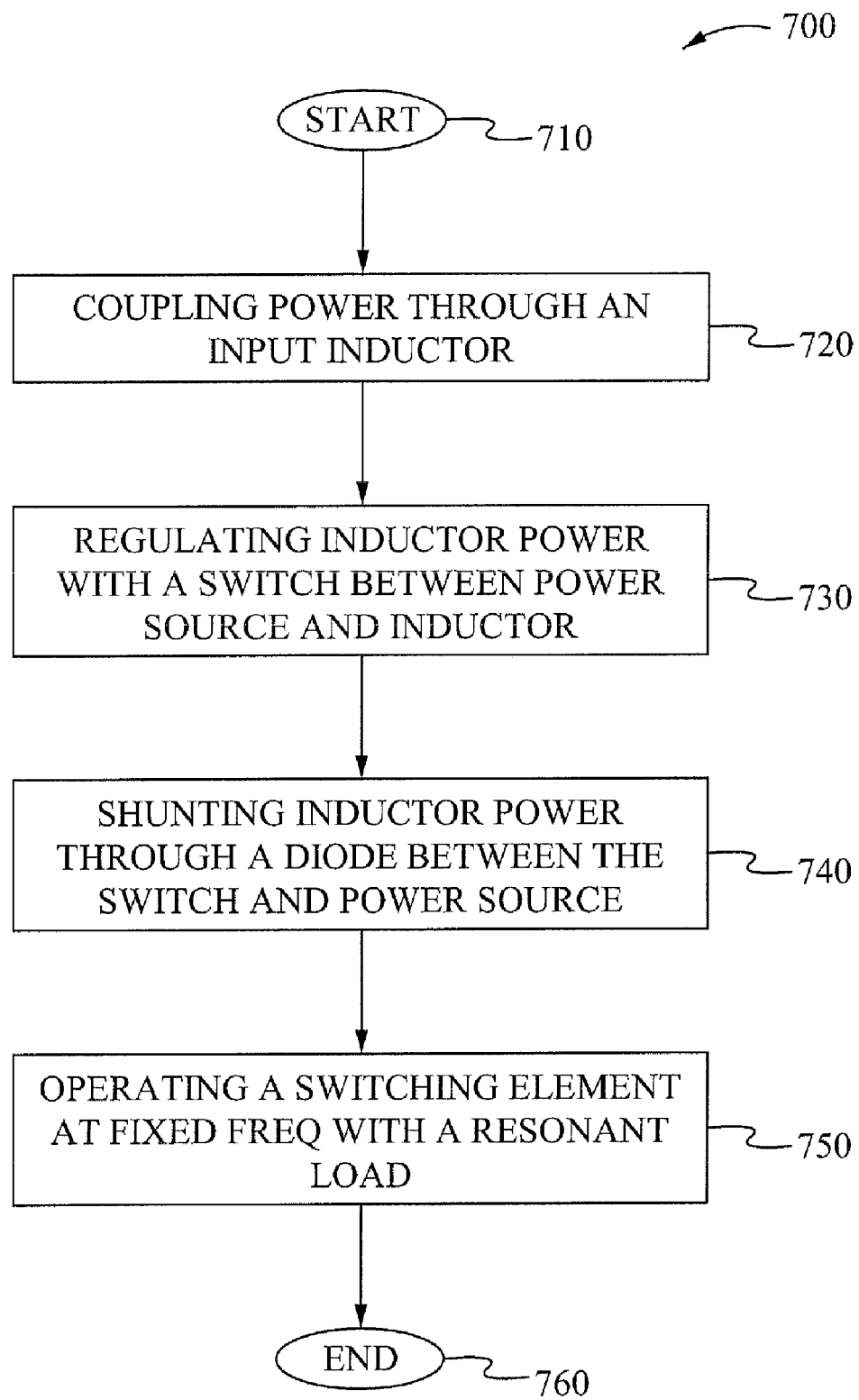
FIG. 7 illustrates a method of converting power in a power converter device according to an embodiment of the present invention.

Turning to FIG. 7, a method 700 of converting power in a power converter device in accordance with the present invention. The device 500 is used as an example in this exemplary embodiment of the method 700. The process begins at the step 710. An input power source VP is provided. The input power source VP comprises a DC voltage signal. In an exemplary embodiment, the DC voltage signal is 20 VDC. At the step 720, a power of the input power source VP is coupled through an input inductor 510. In an alternative embodiment, the power of the input power source VP is coupled through a matching first and second input inductor 610A, 610B (FIG. 6).

At the step 730, a power of the input power source VP is regulated through the input inductor 510 using a switch 524 coupled between the input power source VP and the input inductor 510. The switch 524 is configured to cycle at a rate to control the power through the input inductor 510. A suitable control circuit (not shown) including a pulse width modulation circuit as practiced by a person of ordinary skill can be used to set a duty cycle of the switch 524. In an exemplary embodiment, the switch 524 can be configured to operate in an open loop manner. In the open loop manner, a frequency and the duty cycle of the switch 524 are set at a constant value. In a first 'protection' embodiment, the switch 524 can be used to protect a switching element 512 against over-voltage. In this first protection embodiment, the frequency of the switch 524 can be operated as a function of the voltage of a first terminal of the switching element 512. In a second 'protection' embodiment, the switch 524 can be used to prevent excessive power dissipation of the device 500. In this second protection embodiment, the frequency of the switch 524 can be operated as a function of the voltage to a load circuit 520 or a voltage VOUT. In still a third 'protection' embodiment or a fuse-link embodiment, the switch 524 can include a 100 percent duty cycle or continuously on/closed and be operated so that the switch 524 opens when a high current condition is sensed. Thereby protecting the device 500 from a destructively high current. Any suitable current value can be chosen to operate the fuse-link embodiment depending on the application.

In an alternative embodiment of the method 700, a device 500A includes a p-type MOSFET device 524A (FIG. 5A) substituted for the switch 524 of FIG. 5. The MOSFET device 524A is configured to operate at a duty cycle to suit the particular application. The remainder of the device 500A is similar in structure to the device 500 described above. The method of operation of the device 500A is similar to the method 700 described herein. In another alternative of the method 700, a device 500B includes an n-type MOSFET device 524B substituted for the switch 524 of FIG. 5. The MOSFET device 524B is configured to operate at a duty cycle to suit the particular application. The remainder of the device 500B is similar in structure to the device 500 described above. The method of operation of the device 500B is similar to the method 700 described herein.

In yet another alternative of the method 700, a device 500C includes an n-type MOSFET switch device 524C substituted for the switch 524 of FIG. 5 and also includes a p-type MOSFET shunting device 526C substituted for the shunting diode 526 of FIG. 5. The MOSFET switch device 524C is configured to operate at a duty cycle to suit the particular application. The MOSFET switch device 524C and the MOSFET shunting device 526C are configured to operate synchronously. The synchronous operation of the MOSFET switch and shunting devices 524B, 524C includes enabling each the MOSFET switch device 524C and the MOSFET shunting device 526C so each is 180 degrees out of phase with the other. The remainder of the device 500C is similar in structure to the device 500 described above. The method of operation of the device 500C is similar to the method 700 described herein.

At the step 740, the power of the input inductor 510 is shunted when the switch 524 is open using a shunting diode 526 coupled between the switch 524 and the input inductor 510. The shunting diode 526 provides a current path to ground for the power stored in the input inductor 510.

At the step 750, the switching element 512 is operated at a fixed frequency. The switching element 512 is coupled with the input inductor 510 and a resonant load 511. The switching element 512 comprises a suitable switching device for efficient operation of the device 500. In an exemplary embodiment, the switching element 512 comprises a n-type metal-oxide-semiconductor field-effect transistor (MOSFET) device. The MOSFET device includes a drain, a gate and a source that are synonymous with a first, a second and a third terminal, respectively of the switching element 512. The switching element 512 is configured to operate at the fixed frequency of a driving module 522. The switching element 512 is configured to operate with high efficiency and is configured to consume very little power. When the switching element 512 is turned on, the power consumed by the switching element 512 is approximately zero since the voltage of the drain or first terminal of the switching element 512 is close to zero volts DC and VP multiplied by four and the current through the switching element 512 is equal to zero. When the switching element 512 is turned off, the power consumed by the switching element 512 is also approximately zero since the voltage of the drain or the first terminal of the switching element 512 is approximately zero and the current through the switching element 512 is approximately zero. In an alternative embodiment, a first and second switching element 612A, 612B (FIG. 6) is substituted for the switching element 512.

The resonant load 511 comprises the first and second capacitors 514, 516, the series inductor 518 and the load circuit 520. As described above, each of the components chosen for the resonant load 511 comprises a fixed relationship between the fixed frequency of the driving module 522, the duty cycle of the switching element 512 and a value of the components of the resonant load 511. The fixed frequency of the driving module 522 is equal to a resonant frequency of the resonant load 511. The first and the second capacitors 514, 516 are configured as shunting and series capacitors, respectively. The resistive value of the load circuit 520 can vary depending on the application of the device 500. In an exemplary embodiment, the resistance of the load circuit 520 comprises 50 ohms with a power rating of five watts. The values of second capacitor 516 and the series inductor 518 can be chosen to achieve the desired resonant frequency of the resonant load 511. In an alternative embodiment, a resonant load 611 (FIG. 6) is substituted for the resonant load 511.

The operating the switching element 512 include driving the switching element 512 using a driving module. The driving module 522 comprises a control circuit suitable for providing a sufficient signal to drive the switching element 512. The driving module 522 operates at the fixed frequency equal to the resonant frequency of the resonant load 511. The driving module 522 can comprise a pulse width modulation (PWM) circuit configured to operate at the fixed frequency. Other oscillators can also be used. In an exemplary embodiment, a digital input signal (not shown) is used to enable the driving module 522. The digital input signal comprises a frequency equal to the fixed frequency.

The method 700 ends at the step 760.

The many advantages of the present invention have a wide scope in their application. The present invention provides a power converting circuit with an increased efficiency of Class-E amplifiers and power converter devices. The present invention also provides optimization of power transferred to a resonant load circuit and provides a savings of an inductor and capacitor from a customer bill of materials for each device. The present invention is a significant.

While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

What is claimed is:

1. A differential power converter device comprising:
   an input power source;
   a first and a second input inductor configured for coupling a power of the input power source;
   a switch coupled between the input power source and the first and the second input inductors, wherein the switch is configured to regulate a power of the input power source through the first and the second input inductor;
   a shunting diode configured for shunting the power of the first and the second input inductor when the switch is open;
   a resonant load coupled with the first and the second input inductor comprising a first capacitor, a second capacitor, a third capacitor, a series inductor and a load circuit; and
   a first and a second switching element coupled with the first and the second input inductor, respectively, and coupled with the resonant load, the first and the second switching element configured to operate at a fixed frequency.

2. The device of claim 1, further comprising a control circuit for modulating a frequency of the switch.

3. The device of claim 1, further comprising a driving module for driving the first and the second switching element at the fixed frequency.

4. The device of claim 1, wherein the differential power converter device comprises a Class-E amplifier.

5. The device of claim 1, wherein the input power source comprises a DC voltage signal.

6. The device of claim 5, wherein the DC voltage signal comprises a value approximately equal to 20 VDC.

7. The device of claim 1, wherein the shunting diode is coupled between the switch and the first and the second input inductor.

8. The device of claim 1, wherein the fixed frequency comprises a frequency equal to a resonant frequency of the resonant load.

9. The device of claim 1, wherein the device is configured as an integrated circuit device.

10. The device of claim 1, wherein the switch comprises a MOSFET device.

11. The device of claim 1, wherein the shunting diode comprises instead a MOSFET device and the switch comprises a complimentary MOSFET device.

12. The device of claim 1, wherein the switch is continuously closed and operated as a fuse-link.

* * * * *